(12) United States Patent
Lyman et al.

(10) Patent No.: US 6,624,093 B1
(45) Date of Patent: Sep. 23, 2003

(54) METHOD OF PRODUCING HIGH DIELECTRIC INSULATOR FOR INTEGRATED CIRCUIT

(75) Inventors: Paul F. Lyman, Shorewood, WI (US); Harry T. Johnson-Steigelman, Glendale, WI (US)

(73) Assignee: WiSys Technology Foundation, Madison, WI (US)

( * ) Notice: Subject to any disclaimer, the term of this patent is extended or adjusted under 35 U.S.C. 154(b) by 0 days.

(21) Appl. No.: 10/268,136

(22) Filed: Oct. 9, 2002

(51) Int. Cl.⁷ ........................ H01L 21/31; H01L 21/469
(52) U.S. Cl. ........................ 438/785; 438/287; 438/591
(58) Field of Search ........................ 438/287, 591, 438/685, 765, 785

(56) References Cited

U.S. PATENT DOCUMENTS

| | | | |
|---|---|---|---|
| 6,013,553 A | * | 1/2000 | Wallace et al. ............ 438/287 |
| 6,020,024 A | * | 2/2000 | Maiti et al. ............... 427/248.1 |
| 6,395,650 B1 | * | 5/2002 | Callegari et al. ........... 438/785 |
| 6,420,279 B1 | * | 7/2002 | Ono et al. ................. 438/785 |
| 6,486,080 B2 | * | 11/2002 | Chooi et al. ............... 438/785 |
| 6,495,474 B1 | * | 12/2002 | Rafferty et al. ............ 438/766 |
| 2002/0175393 A1 | * | 11/2002 | Baum et al. ............... 257/506 |
| 2002/0197881 A1 | * | 12/2002 | Ramdani et al. ........... 438/764 |
| 2003/0045080 A1 | * | 3/2003 | Visokay et al. ............ 438/591 |

OTHER PUBLICATIONS

Wilk, G. D. et al., "Electrical Properties of Hafnium Silicate Gate Dielectrics Deposited Directly on Silicon, Applied Physics Letters", vol., No. 19, May 10, 1999.
Wilk, G. D. et al., "High–k Gate Dielectrics: Current Status and Materials Properties Considerations", Journal of Applied Physics, vol. 89, No. 10, May 15, 2001.

* cited by examiner

*Primary Examiner*—Alexander Ghyka
(74) *Attorney, Agent, or Firm*—Quarles & Brady LLP

(57) ABSTRACT

A high dielectric insulator for integrated circuit use is produced by depositing hafnium on a silicon dioxide surface of a silicon wafer and then promoting a solid-state reaction between the silicon dioxide and the hafnium by heating the wafer to produce hafnium silicate.

14 Claims, 1 Drawing Sheet

METHOD OF PRODUCING HIGH DIELECTRIC INSULATOR FOR INTEGRATED CIRCUIT

CROSS-REFERENCE TO RELATED APPLICATIONS

STATEMENT REGARDING FEDERALLY SPONSORED RESEARCH OR DEVELOPMENT

BACKGROUND OF THE INVENTION

The present invention relates to integrated circuit fabrication techniques and specifically to a method of producing an insulating layer on an integrated circuit for structures such as insulated gate field effect transistors (IGFET).

Integrated circuits produced on silicon wafers make use of silicon dioxide ($SiO_2$) as an insulator between conductors including interconnections between circuit elements, capacitor plates, and the gate contact and the current carrying channel (the "transistor channel") separating drain and source contacts.

With the continued miniaturization of circuit elements in ultra-large scale integrated (ULSI circuits), the thickness of the $SiO_2$ layer that forms the insulator in an IGFET must be decreased so as to offset the reduction in area of the gate contact while preserving the necessary capacitive coupling. Although improvements in $SiO_2$ processing have allowed high quality $SiO_2$ layers of the required thickness to be produced to date, a fundamental thickness limitation looms for gate oxides thinner than approximately 12 Å. At this thickness, electron tunneling is expected to provide current leakage that is unacceptably high even for high performance devices and much too high for increasingly popular low power devices.

Electron tunneling could be prevented if a material having a higher dielectric constant ($\kappa$) than $SiO_2$ could be found to serve as the insulation on the gate. With such a high $\kappa$ insulator, the gate insulation could be made physically thicker for a given capacitance dramatically reducing the tunneling.

Potential materials for producing a high $\kappa$ electrical insulator must produce an electrical interface with the silicon having few fixed charges or recombination centers to not limit carrier mobility in the transistor channel. The material should readily adopt an amorphous phase to reduce electrical leakage and doping diffusion along grain boundaries. Further, the material must not be prone to reactions with the silicon substrate that would cause formation of an interfacial $SiO_2$ layer. This latter interfacial $SiO_2$ layer acts to reduce the capacitance of the high $\kappa$ material by adding a small series capacitance lowering the overall capacitance according to standard series additions of capacitance.

Zirconium (Zr) and hafnium (Hf) compounds have been investigated as high $\kappa$ materials for integrated circuit application. Oxides of both elements have high dielectric constants (approximately 25) and can form stable silicate phases ($MSi_xO_y$) M=Hf or Zr) and appear to be stable in contact with silicon at temperatures approaching required integrated circuit processing temperatures. It appears that a relatively small amount of Hf or Zr can significantly increase dielectric constants and that deleterious hafnium-silicon or zirconium-silicon bonds will be energetically unfavorable compared to silicon-oxygen bonds at the interface to the silicon substrate.

Previous attempts to grow hafnium-silicate or hafnium-oxide have used electron beam evaporation of hafnium-silicate onto a bare silicon substrate, sputter deposition of hafnium-silicate onto a bare silicon substrate, or chemical vapor deposition (CVD) of hafnium-oxide or hafnium-silicate on bare silicon substrate.

BRIEF SUMMARY OF THE INVENTION

The electrical and mechanical qualities of the silicon-$SiO_2$ interface are extremely important in the production of semiconductor devices. The present inventors believe that removing the $SiO_2$ layer from the silicon substrate, required in the prior art deposition of hafnium silicate, may result in contamination of the silicon surface, especially in the moderate vacuum levels found in deposition chambers or CVD reactors. This contamination can result in an unwanted, thin $SiO_2$ layer and/or a poor quality silicate layer.

Accordingly, the present invention creates a hafnium-silicate layer without removal of the $SiO_2$ layer, depositing hafnium directly on the $SiO_2$ layer then heating the substrate to promote a solid state reaction producing hafnium-silicate and consuming the underlying $SiO_2$.

Specifically, the present invention provides a method for the manufacture of hafnium-silicate film including the steps of depositing hafnium on the silicon dioxide layer of a silicate substrate and heating the substrate to react the deposited hafnium with the silicon dioxide layer to form a corresponding layer of hafnium-silicate.

Thus, it is one object of the invention to provide a method of producing a hafnium-silicate layer that does not require removal of a protecting silicon dioxide layer from the substrate.

The reaction step may continue until the silicon dioxide-between the hafnium-silicate and the silicon substrate is substantially removed or the hafnium has fully reacted with all silicon dioxide between the hafnium-silicate and the silicon substrate.

Thus, it is another object of the invention to provide method of producing a hafnium-silicate layer that is in direct contact with the silicon without an intervening and capacitance-decreasing layer of silicon dioxide.

The deposition of hafnium may be performed by electron beam evaporation.

Thus, it is another object of the invention to provide a method of depositing hafnium on the silicon dioxide that avoids the ion damage, for example, attendant to sputter deposition.

The foregoing and other objects and advantages of the invention will appear from the following description. In this description, reference is made to the accompanying drawings, which form a part hereof, and in which there is shown by way of illustration, a preferred embodiment of the invention. Such embodiment and its particular objects and advantages do not define the scope of the invention, however, and reference must be made therefore to the claims for interpreting the scope of the invention.

DETAILED DESCRIPTION OF THE PREFERRED EMBODIMENT

Figure 1:
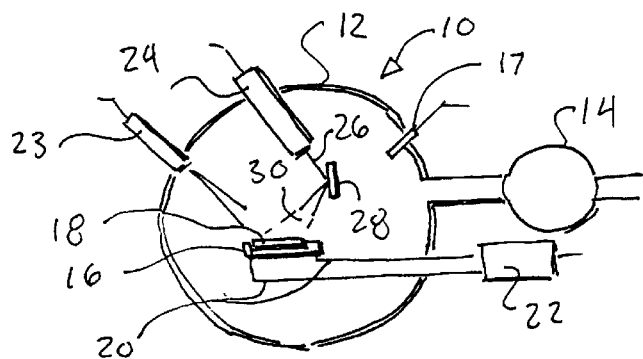
FIG. 1 is a simplified schematic representation of a vacuum chamber suitable for practicing the present invention showing an electron beam evaporator positioned near a substrate that may be heated by a substrate-heating unit.

Referring now to FIG. 1, a reaction chamber 10 provides a vacuum vessel 12 suitable for producing an ultra high vacuum by means of a multistage vacuum pump 14. A vacuum gauge 17 allows control of the vacuum within the region of the vacuum vessel 12 for a predetermined setting.

Positioned within the vacuum vessel 12 is a wafer carrier 16 holding a silicon wafer 18. The wafer carrier 16 includes leads 20 connected to heater control 22 to provide for resistive heating of the silicon wafer 18. An optical pyrometer 23 or similar device may monitor that heating to control the temperature precisely.

An electron gun 24, opening into the vacuum vessel 12, produces an electron beam 26 directed against a hafnium target 28 to create a beam of hafnium 30 directed toward an upper surface of the silicon wafer 18. Electron beam evaporators of this type are described by B. T. Jonker in the *Journal of Vacuum Science Technology* A8, 3883 (1990).

Figure 2:
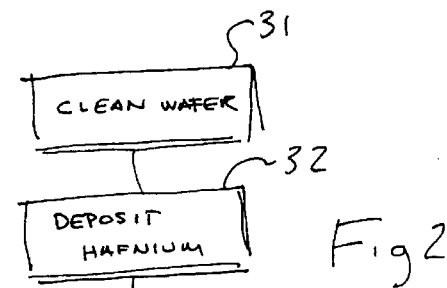
FIG. 2 is a flow chart of the steps of the present invention.
Figure 3:
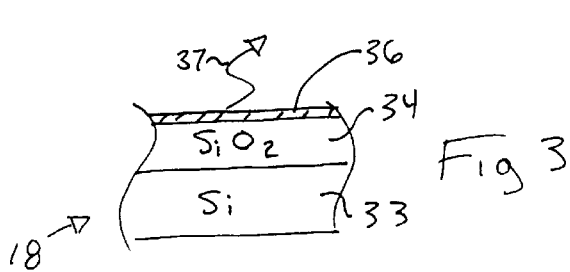
FIG. 3 is a simplified, fragmentary cross-section of the substrate of FIG. 1 before a first cleaning step of the flow chart of FIG. 2.

Referring now to FIGS. 2 and 3, at a first process step 31, a silicon wafer 18 is inserted into the wafer carrier 16. As shown in FIG. 3, the silicon wafer 18 includes a polysilicon layer 33 lying under a silicon dioxide layer 34. The silicon wafer 18 is preferably a commercial Si wafer with doping levels appropriate for eventual device fabrication, and has a high-quality oxide layer (approximately 15 Å thick). Upon receipt of the silicon wafer 18, a layer of surface contamination 36 may be present, for example, of oils or other dirt providing a carbon contamination.

At the process step 31, the silicon wafer 18 is heated by the current through leads 20 to approximately 500° C. rendering a surface nearly free of carbon contamination. Volatile carbon 37 is extracted by the vacuum pump 14.

At a next process step 32, the silicon wafer 18 is cooled to room temperature and a sub-monolayer to monolayer of 99.9% pure hafnium (excluding approximately 3% zirconium) is deposited on the silicon wafer 18 using the electron beam evaporator (comprised of electron gun 24 and target 28).

Figure 4:
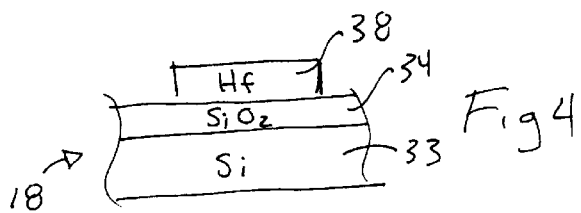
FIG. 4 is a figure similar to that of FIG. 3 showing deposition of metallic hafnium on the surface of the substrate.

Referring to FIG. 4, the hafnium layer 38 is deposited directly on the silicon dioxide layer 34. A restricted region of hafnium deposition may be obtained by masking and etching techniques well known in the art.

Figure 5:
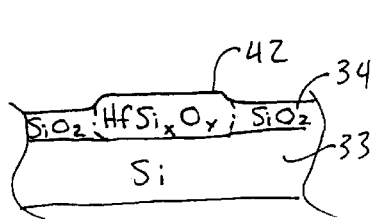
FIG. 5 is a figure similar to that of FIGS. 3 and 4 showing the formation of the hafnium silicate layer after heating the substrate of FIG. 4.

Referring to FIGS. 2 and 5 at succeeding process step 40, the silicon wafer 18 having the hafnium layer 38 is annealed at one or more annealing steps of increasing temperature up to 800° C. but within a range of 750 to 850° C. Each annealing step includes heating and cooling of the silicon wafer. The annealing causes the hafnium layer 38 to form stable silicate phases $HfSi_xO_y$ fully consuming the $SiO_2$ between the deposited hafnium layer 38 and the polysilicon layer 33.

Complete reaction of the hafnium silicate layer 42 may be monitored x-ray photoelectron spectroscopy (XPS) either concurrently with the step 40 or periodically between repetitions of the step 40 at increased annealing temperatures. Specifically, the spectrum obtained by the XPS at process step 40 may be compared against spectra obtained from samples of hafnium compounds formed by electron beam evaporation of thicker films that are subsequently processed to create $HfSiO_2$, $HfO_2$, and $HfSi_xO_y$ as reference spectra. Generally, upon annealing to progressively higher temperatures, the hafnium spectral feature sharpens and the centroid of the peak shifts approximately 0.7 eV to deeper binding energies while beginning to conform to a doublet characteristic of the silicate. When the annealing has been completed, the hafnium features of the XPS spectra of the silicon wafer 18 should match that of the bulk silicate material.

It is believed that the hafnium silicate layer 42 when fully reacted produces an amorphous film that is thermally stable in vacuum to temperatures in excess of 800° C. The inventors have found compelling evidence that the silicate substrate interface is stable against the formation of a silicon dioxide layer beneath the hafnium silicate layer 42.

An additional step after step 40 (not shown) may include full oxidization of the hafnium silicate layer 42 through rapid thermal annealing.

Figure 6:
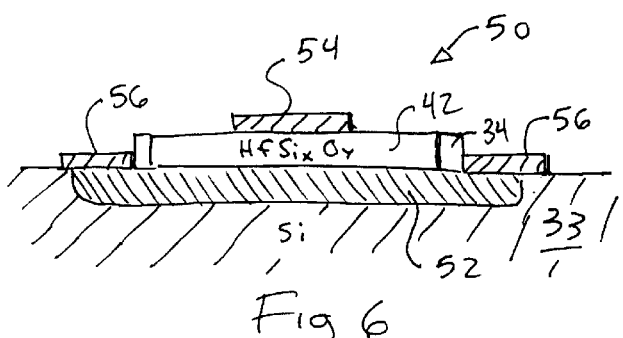
FIG. 6 is simplified, fragmentary cross-section of a substrate showing construction of an insulating gate field effect transistor using the present invention.

Referring now to FIG. 6, an insulated gate field effect transistor 50 may be produced by doping a transistor channel 52 of the silicon layer 33 according to techniques well known in the art and then growing a hafnium silicate layer 42 on top of the transistor channel 52 as described above. A conductive gate pad 54 may then be deposited on top of the hafnium silicate layer 42 to provide for a gate contact and the oxide 34 on either side of the hafnium silicate layer 42 removed to allow a source and drain contact 56 to be placed in contact with the transistor channel 52. The hafnium silicate layer 42 replaces the silicon dioxide layer traditionally used in such devices.

The hafnium silicate layer 42 may also be useful in the production of other circuit elements in integrated circuits where high dielectric material is used and smaller feature size is desired.

The present method provides a number of advantages over direct deposition of silicates. The first is that it allows well-developed procedures for producing a high quality silicon oxide layer on the silicon substrate to be used, ensuring a good silicon-silicon dioxide interface as has been described above. Furthermore, it appears that high quality hafnium silicate cannot be deposited directly on a silicon substrate using electron beam evaporation because such direct deposition promotes deleterious hafnium-silicon bonding.

It is specifically intended that the present invention not be limited to the embodiments and illustrations contained herein, but include modified forms of those embodiments including portions of the embodiments and combinations of elements of different embodiments as come within the scope of the following claims.

We claim:

1. A method for the manufacture of a hafnium silicate film comprising the steps of:
   (a) depositing haffnium on a silicon dioxide layer of a silicon substrate; and
   (b) heating the substrate to react the deposited hafnium with the silicon dioxide layer to form a corresponding layer of hafnium silicate.

2. The method of claim 1 wherein step (b) continues until the silicon dioxide between the hafniium silicate and the silicon substrate is substantially consumed.

3. The method of claim 1 wherein step (b) continues so as react the halhium with substantially all silicon dioxide between the hafnium silicate and the silicon substrate.

4. The method of claim 1 wherein step (a) is conducted substantially at room temperature.

5. The method of claim 1 wherein at step (a) the hafnium deposition is limited to substantially no greater than a monolayer.

6. The method of claim 1 wherein step (a) is performed by electron beam evaporation.

7. The method of claim 6 wherein electron beam evaporation employs a target of at least 99.9% pure combination of hafnium and zirconium metal.

8. The method of claim 1 wherein step (a) is performed by chemical vapor deposition.

9. The method of claim 1 wherein the silicon dioxide layer on the silicon substrate is substantially in a range of 5 to 20 angstroms thick.

10. The method of claim 1 wherein at step (b) the heating is to a temperature within a range of substantially 750 to 850 degrees centigrade.

11. The method of claim 1 wherein step (b) includes repeated heating and cooling of the silicon substrate.

12. The method of claim 1 including the step of monitoring the annealing with x-ray photoelectron spectroscopy (XPS).

13. The method of claim 1 wherein including the initial step of heating the silicon substrate to volatilize carbon contamination.

14. A method for the creation of an insulated gate transistor comprising the steps of:

(a) doping a transistor channel in a silicon wafer;

(b) growing a layer of silicon dioxide over the doped region;

(c) depositing hafnium on the layer of silicon dioxide over the gate region;

(d) heating the substrate to react the deposited hafnium with the silicon dioxide layer to form a corresponding layer of hafnium silicate; and (e) forming a conductor layer over the hafnium silicate to provide a gate contact.

* * * * *

UNITED STATES PATENT AND TRADEMARK OFFICE
CERTIFICATE OF CORRECTION

| | | |
|---|---|---|
| PATENT NO. | : 6,624,093 B1 | Page 1 of 2 |
| APPLICATION NO. | : 10/268136 | |
| DATED | : September 23, 2003 | |
| INVENTOR(S) | : Lyman et al. | |

It is certified that error appears in the above-identified patent and that said Letters Patent is hereby corrected as shown below:

Under Statement Regarding Federally Sponsored Research or Development, the following information should be included:

Col. 1 lines 11-13
"This invention was made with United States government support awarded by the following agencies: NSF DMR-9984442-01. The United States has certain rights in this invention."

| | |
|---|---|
| Col. 2, line 32 | "dioxidc" should be --dioxide--. |
| Col. 2, lines 37-38 | "provide method" should be --provide a method--. |
| Col. 4, claim 1, line 60 | "haffnium" should be --hafnium--. |
| Col. 4, claim 1, line 62 | "hafhium" should be --hafnium--. |
| Col. 4, claim 1, line 66 | "hafniium" should be --hafnium--. |
| Col. 5, claim 3, line 2 | "halhium" should be --hafnium--. |

UNITED STATES PATENT AND TRADEMARK OFFICE
CERTIFICATE OF CORRECTION

| | | |
|---|---|---|
| PATENT NO. | : 6,624,093 B1 | Page 2 of 2 |
| APPLICATION NO. | : 10/268136 | |
| DATED | : September 23, 2003 | |
| INVENTOR(S) | : Lyman et al. | |

It is certified that error appears in the above-identified patent and that said Letters Patent is hereby corrected as shown below:

Delete figs 1-6 and substitute therefor the figs 1-6 shown below.

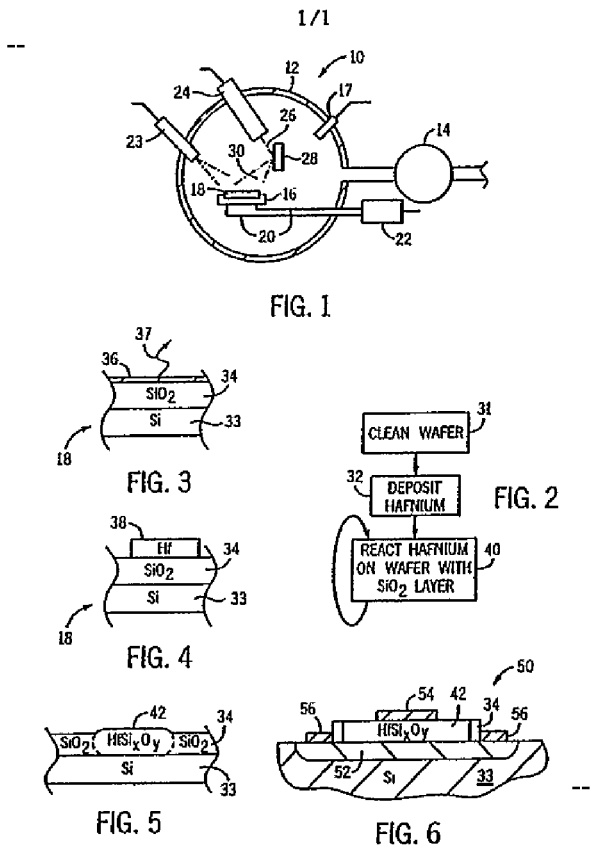

Signed and Sealed this

Twenty-fifth Day of September, 2007

JON W. DUDAS
*Director of the United States Patent and Trademark Office*